US005525979A

United States Patent [19]

Engle et al.

[11] Patent Number: 5,525,979

[45] Date of Patent: Jun. 11, 1996

[54] LOW CONFIGURATION KEYBOARD

[75] Inventors: Vencil D. Engle, Lexington; Andrew C. Hogan; Larry E. Stahlman, both of Versailles, all of Ky.

[73] Assignee: Lexmark International, Inc., Greenwich, Conn.

[21] Appl. No.: 514,938

[22] Filed: Aug. 14, 1995

[51] Int. Cl.$^6$ .................... H03K 17/94

[52] U.S. Cl. .................... 341/32; 341/22; 200/517; 200/512; 200/513; 200/5 A

[58] Field of Search .................... 341/22, 34; 200/517, 200/5 A, 520, 534, 512, 513, 243

[56] References Cited

U.S. PATENT DOCUMENTS

| | | | |
|---|---|---|---|
| 3,900,712 | 11/1980 | Fukao | 341/34 |
| 4,302,647 | 11/1981 | Kandler et al. | 200/159 B |
| 4,468,542 | 9/1984 | Shen | 200/517 |
| 5,115,106 | 5/1992 | Welland et al. | 200/517 |
| 5,298,706 | 3/1994 | English et al. | 200/517 |
| 5,324,902 | 6/1994 | Pounds | 200/517 |
| 5,386,091 | 1/1995 | Clancy | 200/517 |
| 5,438,177 | 8/1995 | Fagan | 200/517 |

*Primary Examiner*—Brent A. Swarthout
*Assistant Examiner*—Albert K. Wong
*Attorney, Agent, or Firm*—John A. Brady

[57] ABSTRACT

A low-profile keyboard (5) each switch (3) having a dished keybutton (3) held upward by a rubber dome (49) and having ribs (55) which depress extension (43 and 31) which carry electrical traces (45 and 33) to activate the switch. The assembly is mounted on post (15). A lower recess (21) permits excess travel to a quiet stop. The rubber sheet (47) provides spill resistance.

8 Claims, 2 Drawing Sheets

LOW CONFIGURATION KEYBOARD

TECHNICAL FIELD

This invention is of a low profile, full size, quiet, sturdy keyboard.

BACKGROUND OF THE INVENTION

Keyboards employing rubber domes a springs and deflection of membranes carrying contacts are generally known. U.S. Pat. No. 5,298,706 to English et al and U.S. Pat. No. 5,115,106 to Welland et al employ the rubber dome as also the operative element to make switch contact. U.S. Pat. No. 4,302,647 to Kandler et al has some cantilevered switch elelments, but does not employ a rubber dome.

DISCLOSURE OF THE INVENTION

The individual switches of the keyboard of this invention have two flexible membranes separated by a spacer membrane. A base element has an upwardly extending first post. The key has a downwardly extending second post which meshes with said first post to provide lateral support while permitting longitudinal movement. A rubber dome with an open top is between the upper flexible membrane and the key.

The membranes each have a hole so that they fit around the first post, with the two flexible membranes having extension carrying conductive leads of the switch facing each other. Under these extensions the base element is recessed. The keybutton has a rib which forces the extensions together to activate the switch while permitting some further travel into the recess to assure reliable electrical contact.

The keyboard can have a low profile, while being quiet and spill resistant.

BRIEF DESCRIPTION OF THE DRAWING

The details of this invention will be described in connection with the accompanying drawings in which.

BEST MODE FOR CARRYING OUT THE INVENTION

Figure 1:
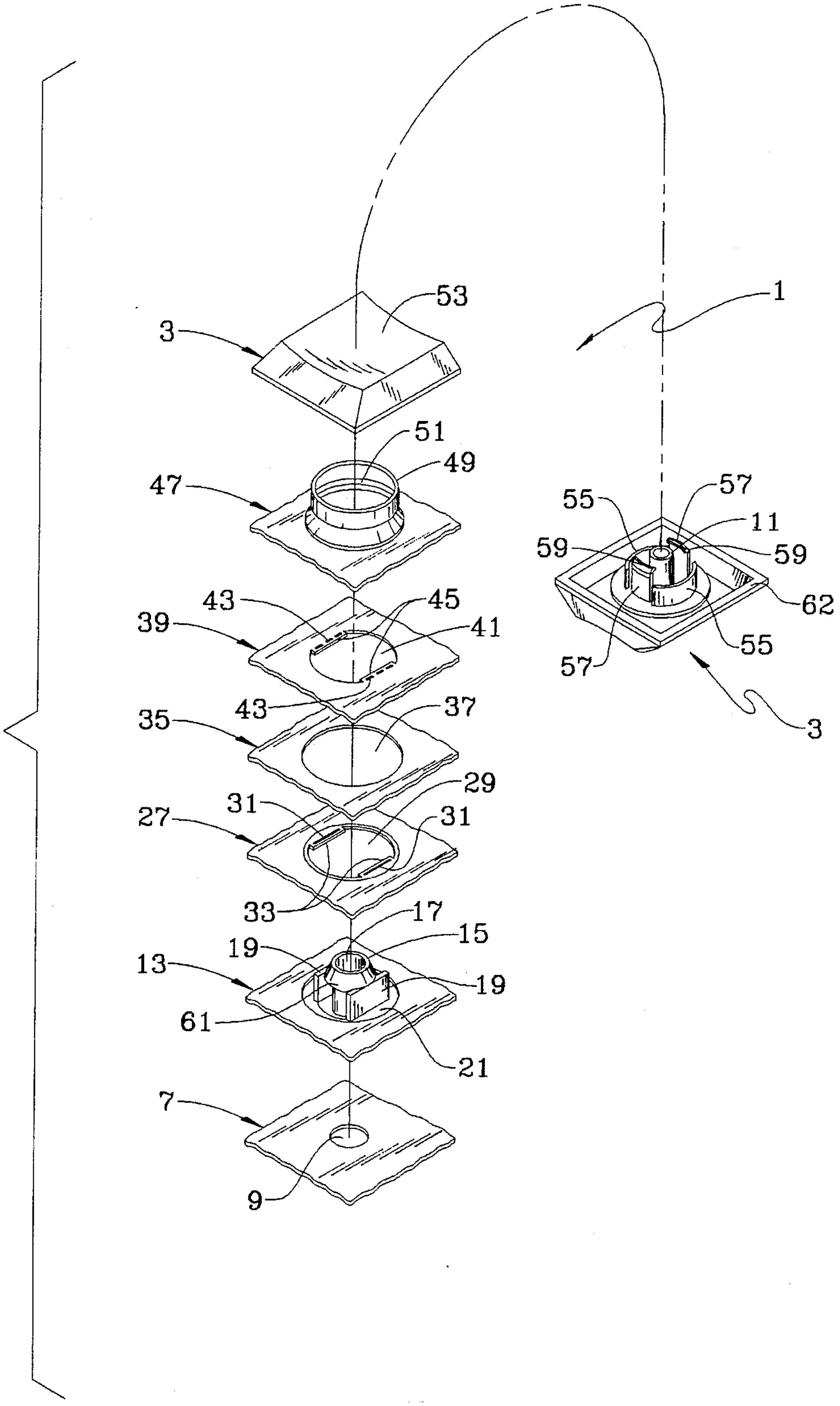
FIG. 1 is an exploded perspective view of the elements of a switch of the subject keyboard.
Figure 4:
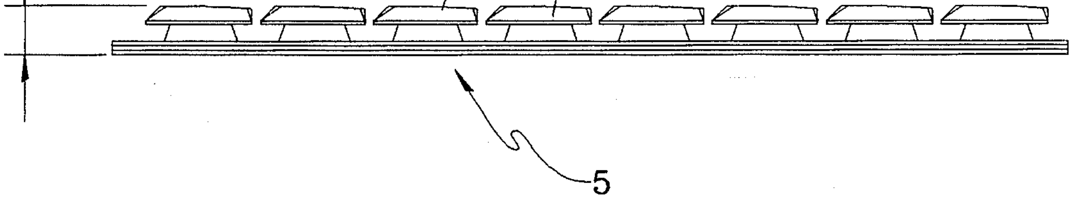
FIG. 4 illustrates the keyboard as a whole from the side, particularly its low profile.

FIG. 1 shows the elements of one switch 1, each switch 1 being activated or deactivated by one keybutton 3, and as shown in FIG. 4, a bank of switches 1 forms a conventional keyboard 5. Keybutton 3 is of conventional for typing and the relative size of other elements is as described and essentially as shown in the drawing. Describing switch 1 from the bottom, each switch 1 is supported on a solid sheet or baseplate 7. Baseplate 7 has a hole 9 which is located to receive post 11 on the underside of keybutton 3 as will be described. Baseplate 7 is a single, continuous element which extends under all of the switches 1 of keyboard 5.

Figure 2:
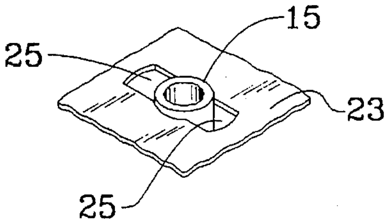
FIG. 2 is a bottom view of the base element.

Mounted on baseplate 7 by adhesive or any mechanical means (not shown) is rigid base 13. Base 13 is part of a single, continuous element having a base 13 at each switch 1. In the middle of base 13 is a upwardly extending post 15 having a central hole 17, and supporting panel 19. On each side of panels 19 is a recess 21. The continuous element containing a base 13 at each switch 1 is molded as a single piece and has a smooth bottom 23 (FIG. 2) extending under recess 21, except that post 15 extends slightly past bottom 23 and the remaining region 25 between panels 19 (FIG. 1) is empty.

Mounted on bast 13 is a first membrane 27 which is 0.003 to 0.005 inches thick (depending on the force desired), having a central, circular hole 29 which surrounds post 15 and panels 19, having extensions 31 which extend over recess 21. The upper sides of extensions 31 carry electrical traces 33. Membrane 27 is a single continuous sheet of pliable polyester resin which extends to all of the switches 1 of keyboard 5. Mounted on membrane 27 is a spacer membrane 35 which is 0.003 to 0.005 inches thick (depending on the force desired), having a central, circular hole 37 which surrounds post 15 and panels 19. Spacer 35 is a single, continuous sheet of sturdy resin which extends to all of the switches 1 of keyboard 5.

Mounted on spacer 35 is a second membrane 39, which is 0.003 to 0.005 inches thick (depending on the force desired), having a central, circular hole 41 which surrounds post 15 and panels 19, having extensions 43 which extend over recess 21. The under sides of extensions 43 carry electrical traces 45 (shown as dotted lines). Membrane 39 is a single, continuous sheet of pliable polyester resin which extends to all of the switches 1 of keyboard 5.

Mounted on membrane 39 is a rubber sheet 47 having an circular, upwardly extending dome 49. Dome 49 has an circular, open center 51 which receives elements on the underside of keybutton 3 as will be described. Dome 49 has sufficient inherent resiliency to hold keybutton 3 to its full extension upward when keybutton 3 is not depressed. Dome 49 is sufficiently soft to collapse under normal downward operating pressure characteristic of typing. Sheet 47 is a single, continuous sheet of synthetic rubber which extends to all of the switches 1 of keyboard 5.

Keybutton 3 has a smooth top surface slightly bowed inward or dished to a 0.5 mm radius to facilitate typing by fingertips, as is conventional. The underside of keybutton 3 has two downwardly extending arc-shaped ribs 55 which extend over recess 21 and two downwardly exiting latching members 57 which are smaller than openings 25 (FIG. 2) and are located to pass into the openings 25 on sufficient downward movement of keybutton 3. Latching nubs 59 flex over outwardly extending nubs 61 on post 15 (best seen in FIG. 3) during installation of switches 1 and then permanently block upward separation of keybutton 3, absent exceptional pressure.

Figure 3:
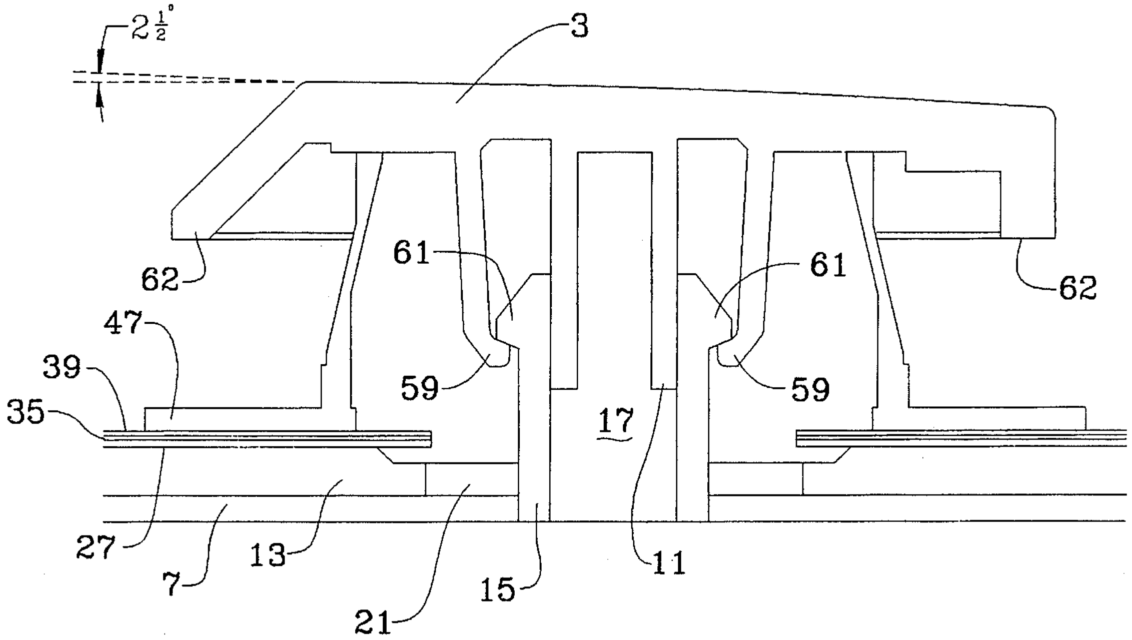
FIG. 3 is a section view through the center of the switch from the side of the keyboard.

FIG. 3 is a view through the center of a switch 1 viewed from the same perspective as FIG. 4, and, for clarity, does not show elements behind post 15. The 0.5 mm dish depth of keybutton 3 is from side to side with respect to the operator, and the tops of keybuttons 3 therefore appear straight from the sided as viewed in FIG. 3 and FIG. 4. The top of keybutton 3 have a 2½ degrees upward slant toward the operator, which is about half that of more conventional keyboards.

FIG. 4 illustrates the full keyboard 5. It has a straight, low profile of 8.9 mm with switches 1 of 2.75 mm total travel. Keybuttons 3 have the dished center, and the small, but discernable upward angle of 2½ degree retains the "feel" of a full size keyboard. The operator of keyboard 5 would be located on the left with respect to FIG. 4.

In operation surface 53 of keybutton 3 is pushed downwardly under normal typing pressure, typically until the bottom surface 62 of keybutton 3 contacts rubber sheet 47. Rubber dome 49 collapses permitting ribs 55 to contact extensions 43 in membrane 39. Extensions 43 bend downward through hole 37 of spacer 35 and then extensions 43 contact extensions 31 of membrane 27. This brings electrical conductors 45 and 33 into contact to make a activate switch 1.

The location of initial contact of conductors 45 and 33 is in free space. This occurs after keybutton 3 has traveled approximately 2.5 mm. Keybutton 3 continues to move downward an additional 0.25 mm before bottom 62 of keybutton 3 encounters rubber 47. This is quiet stop. In performing that movement post 11 traverses opening 17 in post 15 and enters hole 9 of baseplate 7.

Spill resistance is accomplished by the virtually complete cover provided by the rubber dome sheet 47. The keyboard can be adapted to have other standard features, such as a pointing device (strain-gage or force sensing resistance control)located between keybuttons.

Other variations will be apparent or can be anticipated.

What is claimed is:

1. A keyboard comprising individual switches activated by depression of a keybutton at each of said switches each switch including a solid base attached to said keyboard having a vertical post and a recess circumferentially around said post, a first flexible membrane mounted on said base having an opening surrounding said post and an extension .located over said recess, said extension supporting a first electrical conductor of said switch on the side away from said recess, a spacer membrane mounted on said first flexible membrane having an opening surrounding said post and said extension of said first flexible membrane, a second flexible membrane mounted on said spacer membrane having an opening surrounding said post and an extension located over said extension of said first flexible membrane and supporting a second electrical conductor of said switch facing said first electrical conductor of said switch, a resilient membrane having a dome configuration with a hole in the center mounted on said second flexible membrane, and a keybutton having a post and at least one rib, said post of said keybutton movably meshing with said vertical post of said solid base to support said keybutton laterally while permitting longitudinal movement of said keybutton and said rib being positioned over said recess, said dome holding said keybutton away from said base in the absence of keying pressure on said keybutton toward said base and said keybutton being moveable toward said base in response to said keying pressure, said rib extending through said dome for contacting and deflecting said extension of said second flexible member into said extension of said first flexible membrane to bring said first and said second electrical conductors into contact to activate said switch.

2. The keyboard as in claim 1 in which said extension of said first flexible membrane, said recess, said extension of said second flexible membrane, and said rib are on two opposite sides of said post of said base plate.

3. The keyboard as in claim 2 also comprising a base plate having a plurality of holes, each said hole of said base plate being located under said post of said solid base of each said switch, and in which each said post of said solid base has a central hole, said post of said keybutton is held in said central hole for said movably meshing, said central hole opens to said hole of said base plate to permit said post of said keybutton to enter said hole of said base pate, and said ribs are located to force said first and said second electrical conductors into said contact while said hole in said base plate permits further movement of said post of said keybutton and said recess permits further movement of said ribs toward said base.

4. The keyboard as in claim 1 also comprising a base plate having a plurality of holes, each said hole of said base plate being located under said post of said solid base of each said switch, and in which each said post of said solid base has a central hole, said post of said keybutton is held in said central hole for said movably meshing, said central hole opens to said holes of said base plate to permit said post of said keybutton to enter said hole of said base plate, and said rib is located to force said first and said second electrical conductors into said contact while said hole in said base plate permits further movement of said post of said keybutton and said recess permits further movement of said rib toward said base.

5. The keyboard as in claim 4 which has a substantially straight profile with keybuttons having a dished center and being angled upward with respect to an operator of said keyboard about 2½ degrees.

6. The keyboard as in claim 1 which has a substantially straight profile with keybuttons having a dished center and being angled upward with respect to an operator of said keyboard about 2½ degrees.

7. The keyboard as in claim 2 which bas a substantially straight profile with keybuttons having a dished center and being angled upward with respect to an operator of said keyboard about 2½ degrees.

8. The keyboard as in claim 3 which has a substantially straight profile with keybuttons having a dished center and being angled upward with respect to an operator of said keyboard about 2½ degrees.

* * * * *